United States Patent
Ghiu et al.

(12)

(10) Patent No.: US 9,212,788 B2
(45) Date of Patent: Dec. 15, 2015

(54) COMPACT, THERMALLY-ENHANCED SUBSTRATE FOR LIGHTING APPLICATIONS

(75) Inventors: Camil-Daniel Ghiu, Danvers, MA (US); Sarah Bazydola, Belmont, MA (US); Napoli Oza, Boise, ID (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 348 days.

(21) Appl. No.: 13/568,075

(22) Filed: Aug. 6, 2012

(65) Prior Publication Data

US 2013/0033848 A1 Feb. 7, 2013

Related U.S. Application Data

(60) Provisional application No. 61/515,581, filed on Aug. 5, 2011.

(51) Int. Cl.
| | |
|---|---|
| *F21V 21/00* | (2006.01) |
| *F21V 9/16* | (2006.01) |
| *F21V 11/00* | (2015.01) |
| *F21K 99/00* | (2010.01) |
| *H05K 1/18* | (2006.01) |
| *F21V 29/70* | (2015.01) |
| *F21Y 101/02* | (2006.01) |
| *H05K 1/05* | (2006.01) |

(52) U.S. Cl.
CPC ... *F21K 9/00* (2013.01); *F21K 9/56* (2013.01); *F21V 29/70* (2015.01); *H05K 1/183* (2013.01); *F21Y 2101/02* (2013.01); *H05K 1/05* (2013.01); *H05K 2201/10106* (2013.01); *H05K 2201/10121* (2013.01)

(58) Field of Classification Search
CPC ................................. F21V 3/0481; F21V 9/16
USPC ........................ 362/84, 218, 235, 294, 249.02
See application file for complete search history.

(56) References Cited

U.S. PATENT DOCUMENTS

| | | | |
|---|---|---|---|
| 2007/0145398 A1* | 6/2007 | Shin ............................... | 257/98 |
| 2009/0278139 A1 | 11/2009 | Fjelstad | |
| 2011/0058372 A1 | 3/2011 | Lerman et al. | |

FOREIGN PATENT DOCUMENTS

EP 1 890 343 A1 2/2008

OTHER PUBLICATIONS

Andreas Schulz, International Search Report and Written Opinion of the International Searching Authority, Nov. 15, 2012, pp. 1-10, European Patent Office, Rijswijk, The Netherlands.

* cited by examiner

*Primary Examiner* — David V Bruce
(74) *Attorney, Agent, or Firm* — Shaun P. Montana

(57) ABSTRACT

A solid state light source module having a compact, thermally enhanced substrate with one or more recessed pockets, is provided. The module includes a solid state light source and an electrical connection for the solid state light source, such that it is able to receive power so as to generate light. The solid state light source is connected to a substrate having an upper surface and a lower surface. The substrate includes a recessed pocket in the upper surface, defined by a wall and a floor that are at least large enough to accommodate the solid state light source; thus, the solid state light source sits within the recessed pocket. This allows the module to be substantially flat, even with an attached optical system, even utilizing remote phosphor technology, and increases the amount of heat dissipated by a thermal management system that is part of, or connected to, the module.

20 Claims, 2 Drawing Sheets

COMPACT, THERMALLY-ENHANCED SUBSTRATE FOR LIGHTING APPLICATIONS

CROSS-REFERENCE TO RELATED APPLICATION

The present application claims priority of U.S. Provisional Application No. 61/515,581, filed Aug. 5, 2011 and entitled "COMPACT, THERMALLY-ENHANCED SUBSTRATE FOR LIGHTING APPLICATIONS", the entire contents of which are hereby incorporated by reference.

TECHNICAL FIELD

The present invention relates to lighting, and more specifically, to substrates used with solid state light sources.

BACKGROUND

As lighting transitions from traditional light sources (e.g., incandescent, halogen, gas discharge, etc.) to solid state light sources, new obstacles must be overcome. One of the most consistent obstacles with solid state light sources is the amount of heat generated by the solid state light sources themselves, particularly in high power applications that require high lumen output. Typically, lighting products that incorporate solid state light sources use various thermal management solutions to dissipate as much heat as possible. Such solutions include, but are not limited to, passive cooling systems, such as metallic heat sinks using fins and other shapes to greatly increase surface area, as well as active cooling systems, such as fans and other devices that offer increased air circulation.

SUMMARY

Conventional techniques for dissipating heat in lighting products using solid state light sources, such as those described above, suffer from a variety of deficiencies. Passive cooling systems, such as metallic heat sinks, introduce a potentially large and unwieldy component to a solid state light lighting product. Particularly for solid state lighting products that are designed to replace similar products using traditional light sources (e.g., the classic A19 Edison lamp), the need for a large metallic heat sink affects the overall design of the solid state lighting product, in both a technical and aesthetic sense. If a metallic heat sink must be no larger than a particular size, it has an upper limit on the amount of heat it is capable of dissipating. Thus, there will be a limit on the number and type of solid state light sources, based on the total potential heat generated thereby, that may be used in the product. This may potentially limit the lumen output of the solid state lighting product. Further, large, metallic heat sinks cause the solid state lighting product to look quite different from the traditional light source product, which some consumers find undesirable. Active cooling systems also have an upper limit on the amount of heat they are capable of dissipating, leading to problems similar to those described above. Active cooling systems may not take up as much space as a metallic heat sink, but they introduce space-related design constraints of their own. Further, an active cooling system is typically significantly more expensive than a passive cooling system. For solid state lighting products intended for heavy commercial and industrial applications, the increase in cost may be acceptable to the purchaser. However, for solid state lighting products intended for residential and light commercial applications, the typical cost-conscious consumer may not desire to pay the increased price needed to cover the cost of an active cooling system. While improvements in the semiconductor fabrication process of solid state light sources have decreased the amount of heat generated thereby, there still exists a need for an efficient, space and cost economic thermal management solution.

Embodiments described herein provide for a substrate for one or more solid state light sources that includes one or more recessed pockets therein. Each recessed pocket includes one or more solid state light sources. A recessed pocket is sized such that it is at least large enough to accommodate the one or more solid state light sources located therein. In some embodiments, an optical system covers the entire substrate, while in other embodiments, each recessed pocket has its own optical system that sits within the recessed pocket, such that the upper surface of the substrate is flat and/or substantially flat. An optical system may include a remote phosphor.

In an embodiment, there is provided a solid state light source module. The solid state light source module includes: a solid state light source; a substrate having an upper surface and a lower surface, wherein the solid state light source is connected to the substrate, wherein the substrate includes a recessed pocket in the upper surface, wherein the solid state light source is located in the recessed pocket; and an electrical connection from the solid state light source, such that the solid state light source is able to receive power so as to generate light.

In a related embodiment, the substrate may include a substrate having an upper surface and a lower surface, wherein the solid state light source may be connected to the substrate, wherein the substrate may include a recessed pocket in the upper surface, wherein the recessed pocket may be defined by a floor and a wall, wherein the solid state light source may be located in the recessed pocket such that the floor is at least as wide as the solid state light source and the wall is at least as high as the solid state light source.

In another related embodiment, the solid state light source module may further include an optical system, wherein the optical system may be connected to the upper surface of the substrate. In a further related embodiment, the optical system may cover the recessed pocket in the upper surface of the substrate. In a further related embodiment, the optical system may include a protrusion that extends into the recessed pocket.

In another further related embodiment, the optical system may sit within the recessed pocket, such that the upper surface of the substrate is substantially flat. In a further related embodiment, the optical system may include a remote phosphor.

In still another further related embodiment, the wall of the recessed pocket may be substantially straight. In yet another further related embodiment, the wall of the recessed pocket may be inclined. In still yet another further related embodiment, the wall of the recessed pocket may include an inclined portion and a substantially straight portion.

In another related embodiment, the solid state light source module may further include a thermal management system, wherein the thermal management system may be connected to the lower surface of the substrate.

In another embodiment, there is provided a solid state light source module. The solid state light source module includes: a plurality of solid state light sources; a substrate having an upper surface and a lower surface, wherein the plurality of solid state light sources are connected to the substrate, wherein the substrate includes a plurality of recessed pockets in the upper surface, wherein at least one solid state light source in the plurality of solid state light sources is located in at least one respective recessed pocket in the plurality of recessed pockets; and an electrical connection for the plurality of solid state light sources, such that the plurality of solid state light sources is able to receive power so as to generate light.

In a related embodiment, the substrate may include: a substrate having an upper surface and a lower surface, wherein the plurality of solid state light sources may be connected to the substrate, wherein the substrate may include a plurality of recessed pockets in the upper surface, wherein each recessed pocket in the plurality of recessed pockets may be defined by a floor and a wall, wherein at least one solid state light source in the plurality of solid state light sources may be located in at least one respective recessed pocket in the plurality of recessed pockets such that the floor of the respective recessed pocket is at least as wide as the at least one solid state light source and the wall of the respective recessed pocket is at least as high as the at least one solid state light source.

In another related embodiment, the solid state light source module may further include an optical system, wherein the optical system may be connected to the upper surface of the substrate. In a further related embodiment, the optical system may cover the plurality of recessed pockets in the upper surface of the substrate.

In another further related embodiment, the optical system may include a plurality of individual optical systems, wherein each individual optical system in the plurality of individual optical systems may sit within a respective recessed pocket in the plurality of recessed pockets, such that the upper surface of the substrate is substantially flat. In a further related embodiment, at least one individual optical system in the plurality of individual optical systems may include a remote phosphor.

In still another further related embodiment, the wall of at least one recessed pocket in the plurality of recessed pockets may be substantially straight. In yet another further related embodiment, the wall of at least one recessed pocket in the plurality of recessed pockets may be inclined. In still yet another further related embodiment, the wall of at least one recessed pocket in the plurality of recessed pockets may include an inclined portion and a substantially straight portion.

BRIEF DESCRIPTION OF THE DRAWINGS

The foregoing and other objects, features and advantages disclosed herein will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

DETAILED DESCRIPTION

Embodiments provide a substrate capable of supporting one or more solid state light sources, such as but not limited to one or more light emitting diodes (LEDs), organic LEDs (OLEDs), polymer LEDs (PLEDs), and the like, including combinations thereof. As used herein in the singular, the term "solid state light source" may refer to a packaged solid state light source or to a bare solid state light source chip, and in the plural may refer to a set of solid state light sources that includes only packaged solid state light sources, only bare solid state light source chips, or at least one packaged solid state light source and at least one bare solid state light source chip.

Figure 1:
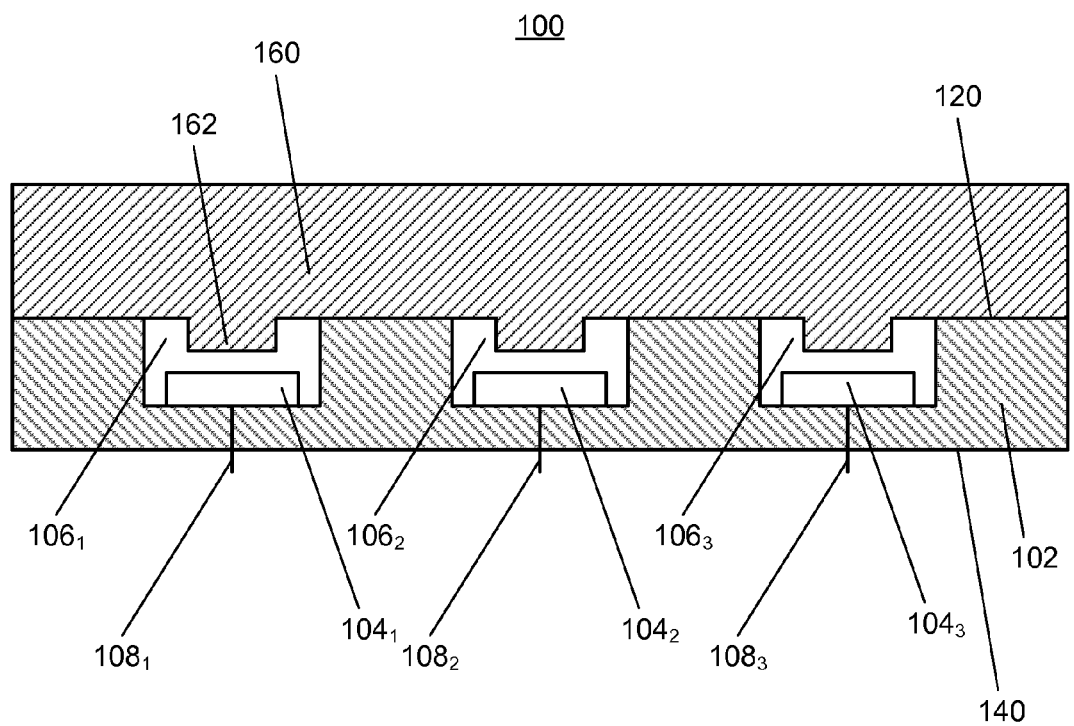
FIG. 1 shows a cross section of a solid state light source module including a plurality of recessed pockets, each for holding one or more solid state light sources, according to embodiments disclosed herein.

A cross section of a solid state light source module 100 including such a substrate 102 is shown in FIG. 1. The substrate 102, which has an upper surface 120 and a lower surface 140, has been modified to achieve a compact, thermally and optically efficient solution to the problem of dissipating heat generated by the plurality of solid state light sources $104_1$, $104_2$, $104_3$. That is, the substrate 102 has been modified to include a plurality of recessed pockets $106_1$, $106_2$, $106_3$ in the substrate 102. The plurality of recessed pockets $106_1$, $106_2$, $106_3$ allow for the mounting of one or more solid state light sources in the plurality of solid state light sources $104_1$, $104_2$, $104_3$ below the upper surface 120 of the substrate 102. This provides a major thermal advantage as well as optical flexibility, as will be described herein. As can be seen in FIG. 1, this is particularly advantageous for applications where a small form factor is needed, as the additional height typically required by having the plurality of solid state light sources $104_1$, $104_2$, $104_3$ between the upper surface 120 of the substrate 102 and an optical system 160 located above the plurality of solid state light sources $104_1$, $104_2$, $104_3$ is now removed.

Figure 2:
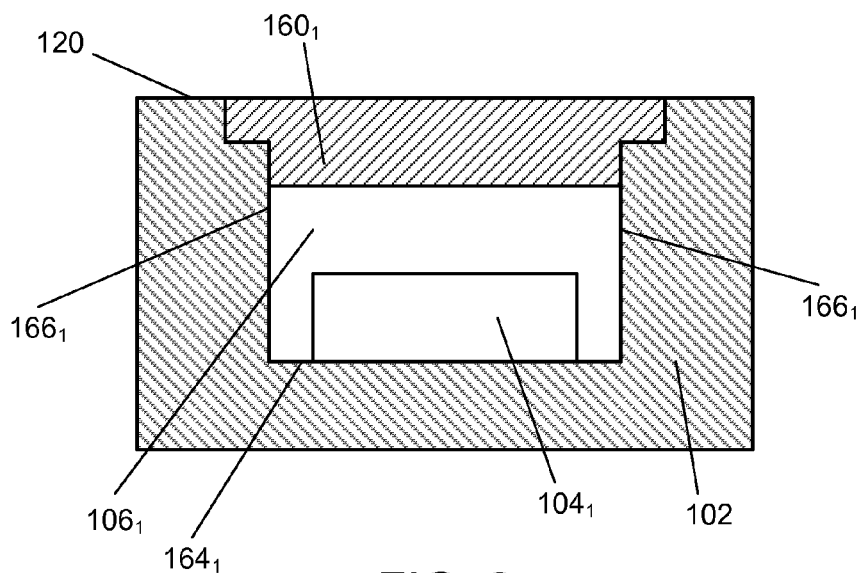
FIG. 2 shows a cross section of a single recessed pocket and the surrounding substrate and optical system according to embodiments disclosed herein.
Figure 3:
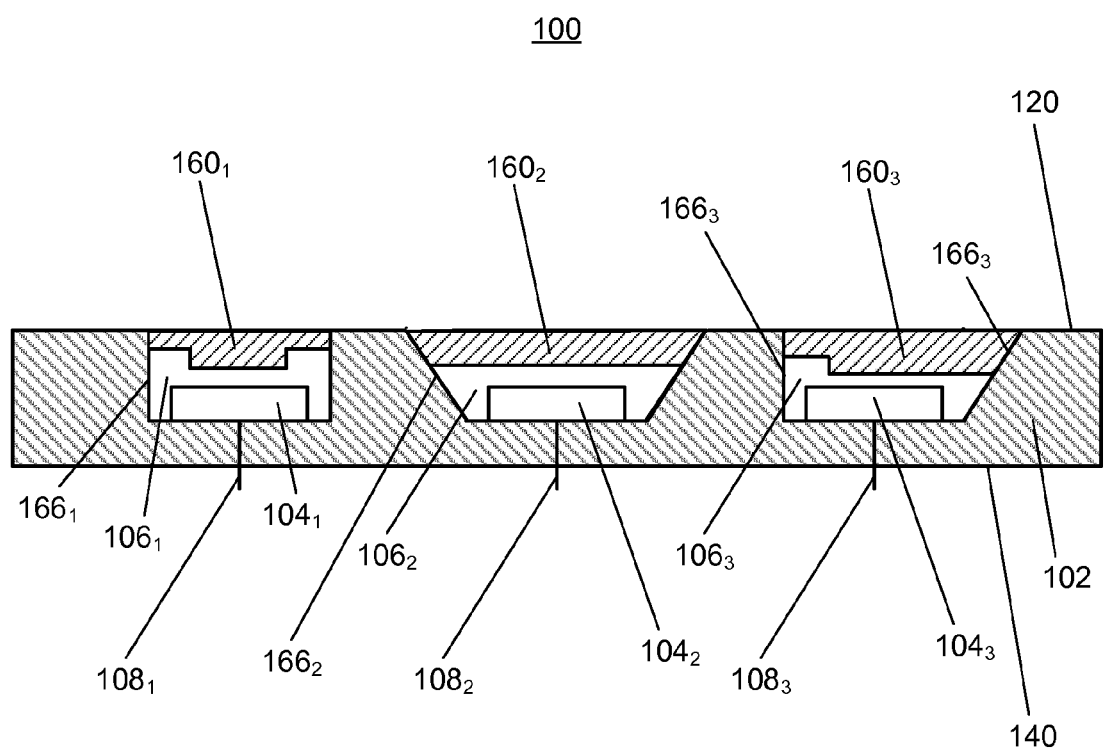
FIG. 3 shows a cross section of an alternative solid state light source module where one recessed pocket has a different shape from another recessed pocket, according to embodiments disclosed herein.

More specifically, as shown in FIGS. 1-3, embodiments enhance the thermal management capabilities of the substrate 102 that is populated with one or more solid state light sources in the plurality of solid state light sources $104_1$, $104_2$, $104_3$. The substrate 102 may be, and in some embodiments is, a printed circuit board, such as but not limited to a metal core board, an FR4 board, and the like. Embodiments are particularly useful in applications that require a flat or substantially flat surface from which light is emitted, such as but not limited to floor tiles, ceiling tiles, walls, and the like. This remains true whether light is produced using a phosphor located on the solid state light source(s) directly (i.e., a packaged solid state light source) or via a remote phosphor application. As discussed above, typical substrates for solid state light sources have the solid state light sources mounted directly on a flat or substantially flat surface of the substrate. For remote phosphor applications, a system including a typical substrate is increased in height by the additional phosphor components. Embodiments allow the form factor of the substrate 102 to remain the same regardless of whether or not a remote phosphor application is used. Further, embodiments considerably reduce the junction temperatures of the plurality of solid state light sources $104_1$, $104_2$, $104_3$ in operation. Finally, embodiments provide for increased ease of packaging and transportation, because of the substantially flat profile of the substrate 102 and, presuming a substantially flat optical system 160, a substantially flat solid state light source module 100.

As seen in FIG. 1, a plurality of recessed pockets $106_1$, $106_2$, $106_3$ are produced in the substrate 102. As seen in FIG. 1 but more clearly in the detail of FIG. 2, the dimensions of each recessed pocket in the plurality of recessed pockets $106_1$, $106_2$, $106_3$ are sized large enough to accommodate at least one solid state light source in the plurality of solid state light sources $104_1$, $104_2$, $104_3$. As shown in FIG. 3, a recessed pocket in the plurality of recessed pockets $106_1$, $106_2$, $106_3$ may be shaped in a variety of ways, so long as at least one solid state light source is able to be placed therein. Referring again to FIG. 2, a recessed pocket $106_1$ in the plurality of recessed pockets $106_1$, $106_2$, $106_3$ is defined by a floor 164 and a wall 166. A solid state light source $104_1$ in the plurality of solid state light sources $104_1$, $104_2$, $104_3$ is located in the recessed pocket $106_1$ such that the floor 164 is at least as wide as the solid state light source $104_1$ and the wall 166 is at least as high as the solid state light source $104_1$. In some embodiments, this may provide for a "snug" fit between the solid state light source and the recessed pocket, though in other embodiments, such as shown in FIG. 2, there may be some space between the sides of the solid state light source $104_1$ and the wall 166 of the recessed pocket $106_1$. Further, in some embodiments (not shown in FIG. 2) a distance may be kept between the bottom surface of the solid state light source and the floor of the recessed pocket, to allow for traditional surface mounting procedures to be used to attach the solid state light source to the pocket of the substrate. In some embodiments, such as where the solid state light source is a bare chip (i.e., in chip form), wirebonding will be also be made inside the recessed pocket. In some embodiments, where the solid state light source is mechanically attached or otherwise connected to the floor of the recessed pocket, there is no space and/or substantially no space between the bottom of the solid state light source and the floor of the recessed pocket. Of course, in all embodiments, there is an electrical connection $108_1$, $108_2$, $108_3$ (shown in FIGS. 1 and 3) between the solid state light source in its recessed pocket and the exterior of the substrate 102, such that power is able to be supplied to the solid state light source so that it emits light. Of course, the electrical connection $108_1$, $108_2$, $108_3$ may be of any known type and may take any known form.

The optical system 160 shown in FIG. 1 is connected to the upper surface 120 of the substrate 102. In some embodiments, such as shown in FIG. 1, the optical system 160 covers each recessed pocket in the plurality of recessed pockets $106_1$, $106_2$, $106_3$ in the upper surface 120 of the substrate 102. In some embodiments, as again shown in FIG. 1, the optical system 160 may include one or more protrusions 162, which extend into one or more of the plurality of recessed pockets $106_1$, $106_2$, $106_3$. This may provide for better optical performance, as well as a specialized optic for a particular solid state light source. That is, a protrusion 162 in the optical system 160 may have different optical characteristics than another portion of the optical system 160 that does not extend into a recessed pocket, for example to more particularly shape the light emitted from the solid state light source in that recessed pocket.

FIG. 2 shows a cross section of a single recessed pocket $106_1$, formed from a floor $164_1$ and a wall $166_1$. In FIG. 2, the wall $166_1$ is substantially flat, except for a slight protrusion at the top of the recessed pocket $106_1$ (i.e., near the upper surface 120 of the substrate 102). This protrusion allows for an individual optical system $160_1$ to sit within the recessed pocket $106_1$, such that the upper surface 120 of the substrate 120 is substantially flat. That is, the individual optical system $160_1$ is placed on top of the recessed pocket $106_1$ so that it is flush and/or substantially flush with the upper surface 120 of the substrate 102. In embodiments where remote phosphor technology is used to produce white light and/or substantially white light and/or light of other wavelengths, the individual optical system $160_1$ will contain the remote phosphor(s). In some embodiments, such as shown in FIG. 3, the optical system 160 is a plurality of individual optical systems $160_1$, $160_2$, $160_3$. In such embodiments, the optical system 160 may contain a variety of different optics $160_1$, $160_2$, $160_3$, with each optic $160_1$, $160_2$, $160_3$ particular to a certain recessed pocket in the plurality of recessed pockets $106_1$, $106_2$, $106_3$ and/or group of optics particular to certain groups of recessed pockets and/or any combinations thereof.

As shown in FIGS. 1-3, a wall $166_1$, $166_2$, $166_3$ of a recessed pocket $106_1$, $106_2$, $106_3$ may be shaped in different ways, depending on, for example, desired optical output and efficiency, which may in turn depend on the type of lighting application. For example, as shown in FIG. 1, a wall of a recessed pocket $106_1$, $106_2$, $106_3$ may be straight, while in some embodiments, such as shown in FIG. 2, a wall $166_1$ of a recessed pocket $106_1$ may be substantially straight. In some embodiments, one portion of a wall may be straight while another portion of a wall is substantially straight. Further, in some embodiments, such as shown in FIG. 3, a wall $166_2$ of a recessed pocket $106_2$ may be inclined, and/or substantially inclined. Of course, combinations of any of these may also be used, such as the recessed pocket $106_3$ of FIG. 3, which includes a portion of a wall $166_3$ that is inclined a portion of the wall $166_3$ that is substantially straight.

Of course, the substrate 102 may be of any size and/or shape appropriate for any type of lighting application. Further, though embodiments are described with respect to a typically shaped substrate (i.e., a flat and/or substantially flat plate) and placement of recessed pockets, optical system (s), and solid state light sources thereon, embodiments are not so limited. For example, the substrate may be cubical shaped, with recessed pockets in any side and/or combination of sides of the cubical shape, and corresponding optical system(s) over the pockets. The substrate 102 may take other three-dimensional shapes (for example but not limited to pyramids, rectangular solids, and the like) may be used without departing from the scope of embodiments as described herein.

Further, in some embodiments, the optical system(s), when placed on the substrate 102, may not result in a flat or substantially flat surface, but rather, may create a rise (i.e., increased height) in certain sections for better optical efficiency and/or for certain desired optical properties.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

What is claimed is:

1. A solid state light source module, comprising:
   a solid state light source;

a substrate having an upper surface and a lower surface, wherein the solid state light source is connected to the substrate, wherein the substrate includes a recessed pocket in the upper surface, wherein the solid state light source is located in the recessed pocket; and an electrical connection from the solid state light source, such that the solid state light source is able to receive power so as to generate light.

2. The solid state light source module of claim 1, wherein the substrate comprises:
   a substrate having an upper surface and a lower surface, wherein the solid state light source is connected to the substrate, wherein the substrate includes a recessed pocket in the upper surface, wherein the recessed pocket is defined by a floor and a wall, wherein the solid state light source is located in the recessed pocket such that the floor is at least as wide as the solid state light source and the wall is at least as high as the solid state light source.

3. The solid state light source module of claim 1, further comprising:
   an optical system, wherein the optical system is connected to the upper surface of the substrate.

4. The solid state light source module of claim 3, wherein the optical system covers the recessed pocket in the upper surface of the substrate.

5. The solid state light source module of claim 4, wherein the optical system includes a protrusion that extends into the recessed pocket.

6. The solid state light source module of claim 3, wherein the optical system sits within the recessed pocket, such that the upper surface of the substrate is substantially flat.

7. The solid state light source module of claim 6, wherein the optical system includes a remote phosphor.

8. The solid state light source module of claim 2, wherein the wall of the recessed pocket is substantially straight.

9. The solid state light source module of claim 2, wherein the wall of the recessed pocket is inclined.

10. The solid state light source module of claim 2, wherein the wall of the recessed pocket includes an inclined portion and a substantially straight portion.

11. The solid state light source module of claim 1, further comprising:
    a thermal management system, wherein the thermal management system is connected to the lower surface of the substrate.

12. A solid state light source module, comprising:
    a plurality of solid state light sources;
    a substrate having an upper surface and a lower surface, wherein the plurality of solid state light sources are connected to the substrate, wherein the substrate includes a plurality of recessed pockets in the upper surface, wherein at least one solid state light source in the plurality of solid state light sources is located in at least one respective recessed pocket in the plurality of recessed pockets; and
    an electrical connection for the plurality of solid state light sources, such that the plurality of solid state light sources is able to receive power so as to generate light.

13. The solid state light source module of claim 12, wherein the substrate comprises:
    a substrate having an upper surface and a lower surface, wherein the plurality of solid state light sources are connected to the substrate, wherein the substrate includes a plurality of recessed pockets in the upper surface, wherein each recessed pocket in the plurality of recessed pockets is defined by a floor and a wall, wherein at least one solid state light source in the plurality of solid state light sources is located in at least one respective recessed pocket in the plurality of recessed pockets such that the floor of the respective recessed pocket is at least as wide as the at least one solid state light source and the wall of the respective recessed pocket is at least as high as the at least one solid state light source.

14. The solid state light source module of claim 12, further comprising:
    an optical system, wherein the optical system is connected to the upper surface of the substrate.

15. The solid state light source module of claim 14, wherein the optical system covers the plurality of recessed pockets in the upper surface of the substrate.

16. The solid state light source module of claim 14, wherein the optical system comprises a plurality of individual optical systems, wherein each individual optical system in the plurality of individual optical systems sits within a respective recessed pocket in the plurality of recessed pockets, such that the upper surface of the substrate is substantially flat.

17. The solid state light source module of claim 16, wherein at least one individual optical system in the plurality of individual optical systems includes a remote phosphor.

18. The solid state light source module of claim 13, wherein the wall of at least one recessed pocket in the plurality of recessed pockets is substantially straight.

19. The solid state light source module of claim 13, wherein the wall of at least one recessed pocket in the plurality of recessed pockets is inclined.

20. The solid state light source module of claim 13, wherein the wall of at least one recessed pocket in the plurality of recessed pockets includes an inclined portion and a substantially straight portion.

* * * * *